(12) United States Patent
Falck et al.

(10) Patent No.: US 7,291,899 B2
(45) Date of Patent: Nov. 6, 2007

(54) POWER SEMICONDUCTOR COMPONENT

(75) Inventors: Elmar Falck, Ottobrunn (DE); Anton Mauder, Kolbermoor (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/941,421

(22) Filed: Sep. 15, 2004

(65) Prior Publication Data

US 2005/0116287 A1    Jun. 2, 2005

(30) Foreign Application Priority Data

Sep. 15, 2003   (DE) ................... 103 42 559

(51) Int. Cl.
*H01L 29/76* (2006.01)
(52) U.S. Cl. .............. 257/621; 257/171; 257/328; 257/329; 257/330; 257/E29.257
(58) Field of Classification Search ............. 257/621, 257/171, 328–330, E29.257
See application file for complete search history.

(56) References Cited

U.S. PATENT DOCUMENTS

| | | | |
|---|---|---|---|
| 4,639,288 A * | 1/1987 | Price et al. ............... 438/430 |
| 6,140,156 A * | 10/2000 | Tsai ........................ 438/148 |
| 6,333,519 B1 * | 12/2001 | Nakazawa ................ 257/72 |
| 6,433,385 B1 * | 8/2002 | Kocon et al. ............. 257/328 |
| 6,573,560 B2 * | 6/2003 | Shenoy ..................... 257/330 |
| 6,818,939 B1 * | 11/2004 | Hadizad ................... 257/302 |
| 6,841,849 B2 * | 1/2005 | Miyazawa ................ 257/621 |
| 6,882,030 B2 * | 4/2005 | Siniaguine ............... 257/621 |
| 2002/0113263 A1 * | 8/2002 | Fujishima et al. ........ 257/330 |
| 2002/0185680 A1 | 12/2002 | Henninger et al. |
| 2003/0022474 A1 * | 1/2003 | Grover et al. ............. 438/570 |

* cited by examiner

*Primary Examiner*—Eugene Lee
(74) *Attorney, Agent, or Firm*—Dicke, Billig & Czaja, PLLP

(57) ABSTRACT

A semiconductor component suitable for use as a power semiconductor component and method of making a semiconductor component is disclosed. In one embodiment, the semiconductor component includes a semiconductor body having a first surface, a second surface, a third surface, a first conduction type region and a second conduction type region adjoining the first conduction type region at the third surface. A trench extending from the first surface into the semiconductor body, the trench defined by a trench bottom and an arcuately shaped sidewall.

21 Claims, 3 Drawing Sheets

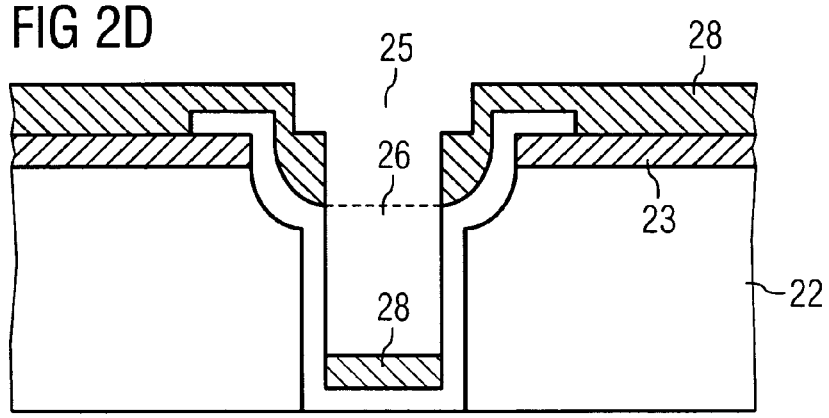
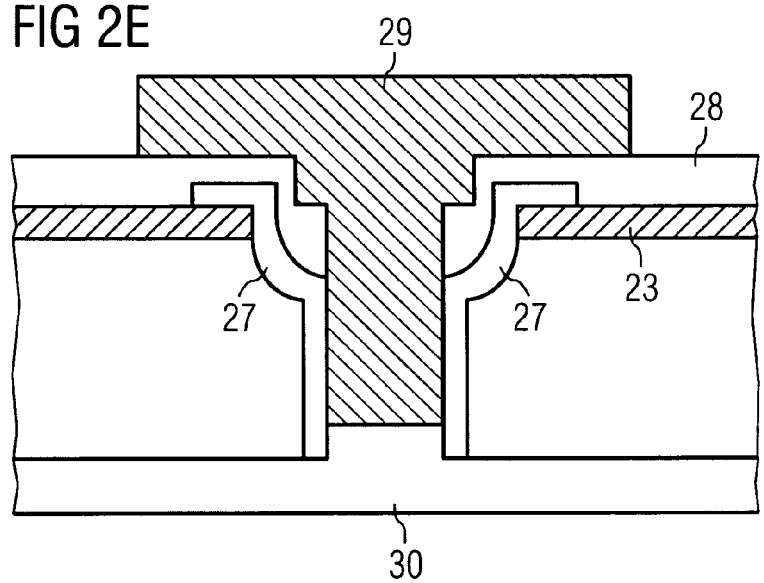
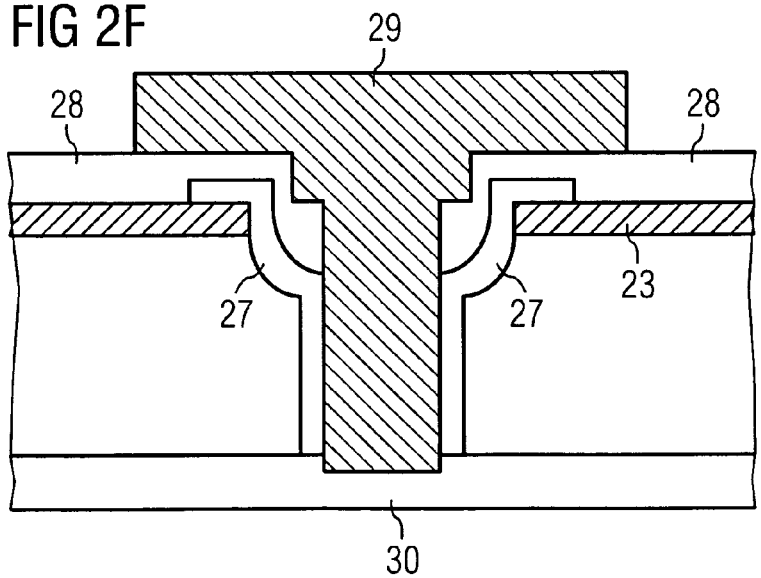

POWER SEMICONDUCTOR COMPONENT

CROSS-REFERENCE TO RELATED APPLICATIONS

This Utility Patent Application claims priority to German Patent Application No. DE 103 42 559.4, filed on Sep. 15, 2003, which is incorporated herein by reference.

FIELD OF THE INVENTION

The invention relates to a power semiconductor component and to a method for fabricating a power semiconductor component.

BACKGROUND

The edge structure of power semiconductor components is accorded a particular importance since the blocking capability of real pn junctions is drastically reduced compared with the bulk blocking capability of a plane-parallel junction because a major curvature of the equipotential lines and thus a significant increase in field strength occur in the edge region of the semiconductor component. The critical field strength in silicon is thus attained substantially earlier. Without additional measures, the blocking capability in the case of a power semiconductor component of the 1200 volts class with a 5 µm deep p-type well typically amounts to only 15% of the bulk breakdown voltage. For economic and thus practical operation of the semiconductor component, it is necessary for the dielectric strength of the edge termination to approach that of the cell array as near as possible. In order additionally to increase the robustness of the component, the blocking capability of the edge should even exceed that of the cell array. A further requirement made of an optimum edge structure is to take up little silicon area, in order to keep down the chip costs.

Known structures and measures for reducing such increases in field strength are field rings, single- or multi-stage field plates, less highly doped p-type zones located upstream of the p-type well, laterally varied p-type doping or combinations of these measures. It has thus been possible to increase the blocking capability up to approximately 90% of the bulk blocking capability. What is disadvantageous about all these structures and measures is that, depending on the voltage class or type of the power semiconductor component, complex simulations are necessary for the correct design of the edge termination, and, moreover, the fabrication of such edge structures requires additional method steps and additional chip area. A further disadvantage of such edge structures is the charge that is stored in the edge region in the case of bipolar power semiconductor components and increases the turn-off losses without significantly improving the properties of the semiconductor component in the on-state case.

In order to reduce the required chip area of the edge structure of a trench power semiconductor component, DE 101 27 885 A1 discloses arranging the field plate in the case of low-voltage transistors at least partly in a trench structure. With this form of edge termination, the insulation layer of the edge trenches is made thicker on the outer sidewall arranged opposite to the cell array, in order thus to increase the breakdown strength. The edge trench lined with an insulation layer is incidentically filled with conductive material, in particular polycrystalline silicon, which thus forms a field plate reaching into the depth of the component.

What is disadvantageous about this form of an edge structure is the dimensioning of the component edge that has to be determined anew for each voltage type, and the very thick insulator layers required for high reverse voltages.

SUMMARY

The present invention provides embodiments of a semiconductor component suitable for use as a power semiconductor component and methods of making a semiconductor component. In one embodiment, the semiconductor component includes a semiconductor body having a first surface, a second surface, a third surface, a first conduction type region and a second conduction type region adjoining the first conduction type region at the third surface. A trench extending from the first surface into the semiconductor body, the trench defined by a trench bottom and an arcuately shaped sidewall.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 2A through FIG. 2F are sectional views illustrating an exemplary embodiment of one method for fabricating an edge structure of a power semiconductor diode.

DETAILED DESCRIPTION

Figure 1:
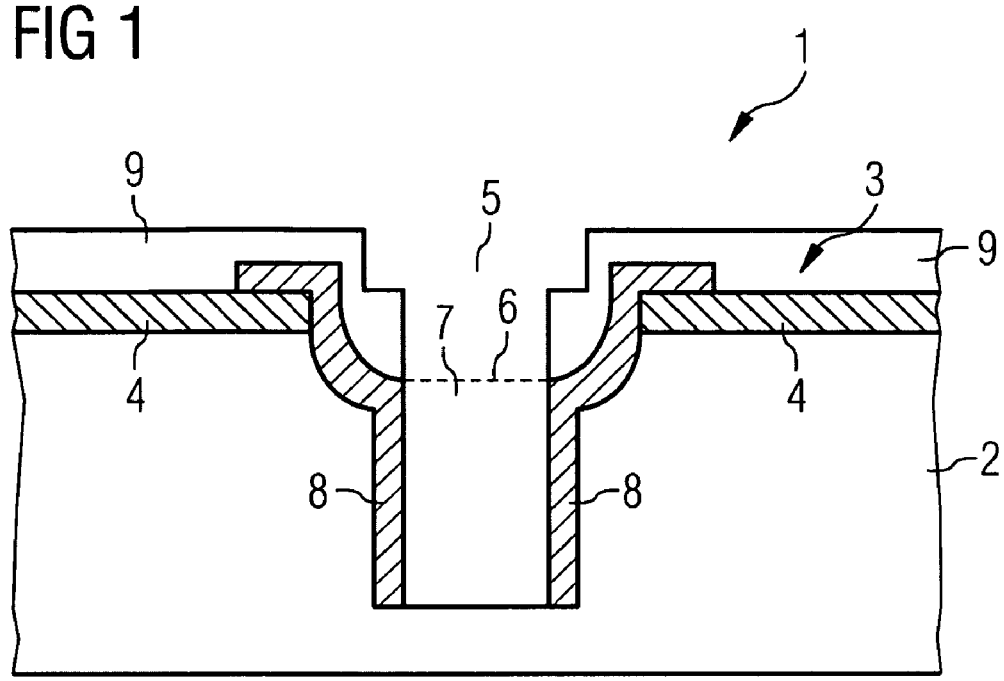
FIG. 1 is a sectional view illustrating one example embodiment of a power semiconductor diode edge structure.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is an object of the present invention to specify an edge structure of a power semiconductor component and a method for fabricating a power semiconductor component having the abovementioned edge structure for which the disadvantages described above are overcome.

This object is achieved by means of the defining features of patent claim 1 and by means of patent claim 7. Advantageous developments of the invention are specified in the subclaims.

The specified edge structure of a power semiconductor component, e.g. a diode, makes it possible to produce components of different voltage classes using a single mask set. The masks and the insulation layer thickness are dimensioned essentially only to the depth of the pn junction. For the blocking capability, it is merely necessary to choose a basic material adapted in accordance with the resistance and the thickness. In the case of transistors, at the very least a new calculation is not necessary for the edge structure. Particular advantages arise in the case of small device dimensions and expensive fabrication methods, since the loss of active chip area can be minimized with this edge termination.

The edge structure of a power semiconductor component—claim 1—comprises a semiconductor body of a first conduction type, e.g. n-doped silicon, with a first and a second surface, generally front and rear side of the silicon wafer. Situated in said power semiconductor component, in a maimer adjoining the first surface, is a region of a second conduction type, e.g. p-type doping, and a trench with a trench bottom that extends from the first surface into the semiconductor body of a first conduction type. Said trench has a sidewall that merges arcuately concavely with the trench bottom. A further trench is arranged within the trench. The end of the arcuately concave rounding must be located deeper than the junction between one conduction type and the other conduction type. In order to curve the equipotential lines innocuously and thus to avoid disturbing field increases, it is necessary for the end of the electrically conductive layer, also called field plate, to be located parallel to the pn junction since an end, e.g. within the rounding, would be associated with a high field spike at the end of the field plate and thus with a significant reduction of the breakdown voltage. By contrast, a somewhat lengthened field plate on a plane parallel to the pn junction does not impair the blocking performance. It is not necessary for the field plate to reach far beyond the depth of the pn junction, rather it suffices, in contrast to the trench contacts in the case of low-voltage transistors, merely to effect shielding in the region around the pn junction.

In a further advantageous embodiment of the invention—claim 2—an electrically conductive layer is applied to the second surface of the semiconductor body, and makes contact with the semiconductor body. For a bipolar transistor, for example, said layer forms the emitter contact.

In a further advantageous embodiment—claim 3—of the invention, the trenches and parts of the first surface are filled, and covered, with a second electrically insulating material. Said material, e.g. polyimide, protects the power semiconductor component against voltage flashovers during testing and after mounting.

In a further advantageous embodiment of the invention—claim 4—a barrier layer, e.g. silicon nitride or titanium nitride, is arranged above the insulation layer, and protects the power semiconductor component against moisture and ions and thus constributes to stabilizing the blocking properties.

In order to fabricate the edge structure of a power semiconductor component—claim 7—provision is made of a semiconductor substrate of a first conduction type with a first and a second surface and a doped region of a second conduction type that adjoins the first semiconductor surface and is arranged in the semiconductor body. After the masking and patterning of the edge of the power semiconductor component, a first trench is formed at the component edge with a sidewall that merges arcuately concavely with the trench bottom, for example by means of an isotropic trench etching. This is then followed by the formation of a second trench penetrating through the trench bottom within the first trench and the removal of the masking.

After the production of an oxide at the free surfaces of the power semiconductor component, the contact regions of the first semiconductor surface are fabricated. The removal of the masking layer for the contact regions is followed by the deposition of an electrically conductive layer on the first semiconductor surface and on parts of the first and second trenches. Finally, an emitter electrode is formed by means of the deposition of an electrically conductive layer on the second surface of the semiconductor body.

By means of the method described, through a plane-parallel pn junction which may either cover the entire front side of a chip or may alternatively be patterned in cellular fashion, a trench is etched as far as the end of the active area, and said trench is covered with a field plate that is isolated from the silicon by an insulator layer, e.g. silicon dioxide. Further within the cell array, said field plate is connected to the anode or source potential. In a manner adjoining the first surface of the semiconductor body, the silicon edge is rounded arcuately concavely, e.g. by means of isotropic etching. For this purpose, the arcuately concave rounding of the trench bottom must reach deeper into the semiconductor body than the pn junction, i.e. preferably about 20% further, that is to say approximately 1 to 20 μm. The width of the trench is essentially determined by the space required for singulation of the chips. The semiconductor surface remains largely undisturbed by the production of the trench, e.g. by means of a laser, etching or sawing. This is appropriate primarily for pn junctions lying deep. e.g. 20 μm, below the first surface. Edges and spikes that are possibly present can be rounded by means of an oxidation step after formation of the trench.

In an advantageous embodiment—claim 8—of the invention, after the deposition of the oxide layer into the trench, a layer made of silicon nitride is deposited, which constitutes an effective barrier against moisture and ions and thus contributes to stabilizing the properties. In a further advantageous embodiment of the power semiconductor component according to the invention, an insulation layer is deposited on the chip rear side, the thickness of which insulation layer guarantees a sufficient insulation effect with respect to the rear side potential, since here the electric field at a distance of a few μm from the rear side metallization still has a finite value.

In a further advantageous embodiment of the method for fabricating an edge structure of a power semiconductor component—claim 9—after the deposition of the electrically conductive layer on the first semiconductor surface and on parts of the first and second trenches, the first and second trenches are filled with polyimide and this polyimide filling is subsequently patterned. This makes it possible to avoid voltage flashovers during measurement, e.g. for testing or after the mounting.

In a further advantageous embodiment of the method for fabricating an edge structure of a power semiconductor component—claim 10—before the deposition of the electrically conductive layer on the second surface of the semiconductor body, a contact and/or emitter implantation is introduced into the second surface of the semiconductor body. Particularly in the case of pin-type or pn n-type diodes, given forward-biasing, the resistivity of the intrinsic zone is thus greatly reduced by the injection of charge carriers from the emitter. The charge carrier concentration that is established is determined both by the forward voltage and by the recombination within and at the edge of the intrinsic zone.

The edge structure according to the invention and its developments can also be used for power semiconductor components such as e.g. MOSFETs or IGBTs.

FIG. 1 illustrates a sectional illustration through an edge structure of a power semiconductor component 1, namely a diode or transistor, comprising a semiconductor body of a first conduction type 2, e.g. n conduction type, and a region of a second conduction type 4, e.g. p conduction type, that adjoins the first surface 3 of the semiconductor body.

A first trench 5 with an arcuately concavely rounded sidewall is introduced through the first surface 3 of the semiconductor body, a second trench 7 extending into the semiconductor body 2 through the trench bottom 6 of said first trench. Prior to the singulation of the semiconductor wafer that forms the semiconductor body into individual semiconductor components, the sectional illustration of the trenches has an axial symmetry that is absent from the sectional illustration of a semiconductor component after singulation. An insulation layer 8 made of a first electrically insulating material is applied on the trench walls and on regions adjoining the first trench on the first surface of the semiconductor body. Parts of the insulator layer and of the first surface of the semiconductor body 2 are covered with an electrically conductive layer 9. FIG. 2A to FIG. 2F illustrate an exemplary embodiment of a method for fabricating an edge structure according to the invention of a power semiconductor diode.

Figure 2A:
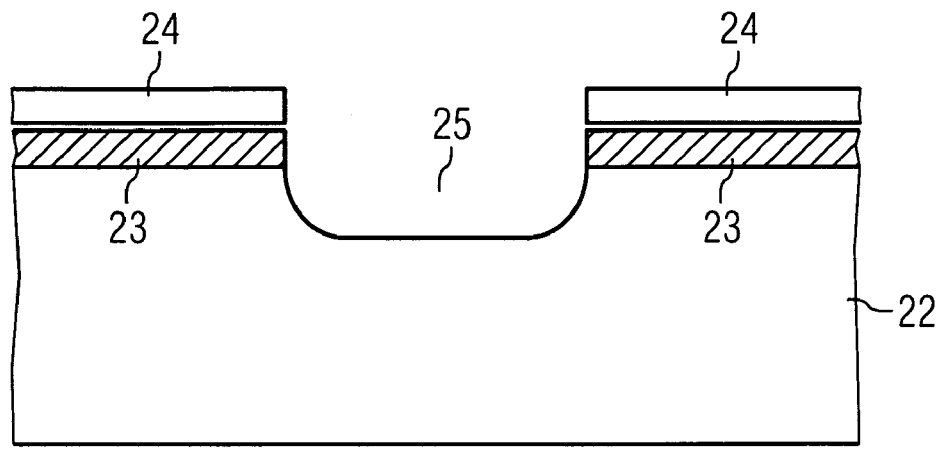

FIG. 2A illustrates the edge structure of a power semiconductor component after a first region of a second conduction type 23 has been introduced into a semiconductor substrate of a first conduction type 22 e.g., by means of ion implantation. A corresponding basic material is to be chosen here depending on the voltage class. The thickness of the basic material can be estimated by way of the formula:

Thickness [μm]=reverse voltage [V]/10.

Typical implantation doses are e.g., $10^{12}$ to $10^{14}$ dopant atoms/$cm^2$ for a p-type doping. After the outdiffusion of this dopant of the second conduction type and the application and patterning of a mask layer 24, a first trench 25 with a concave rounding at the component edge was formed, e.g., by means of an isotropic etching, approximately 1.2 to 2.5 times as deep as the pn junction.

Figure 2B:
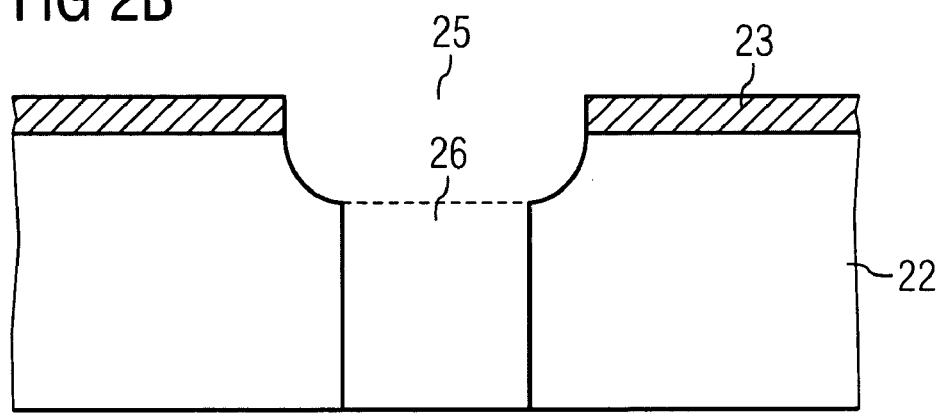

FIG. 2B illustrates the edge structure of the power semiconductor component in a later stage after the etching of the second wide trench 26 and the stripping of the trench masking.

Figure 2C:
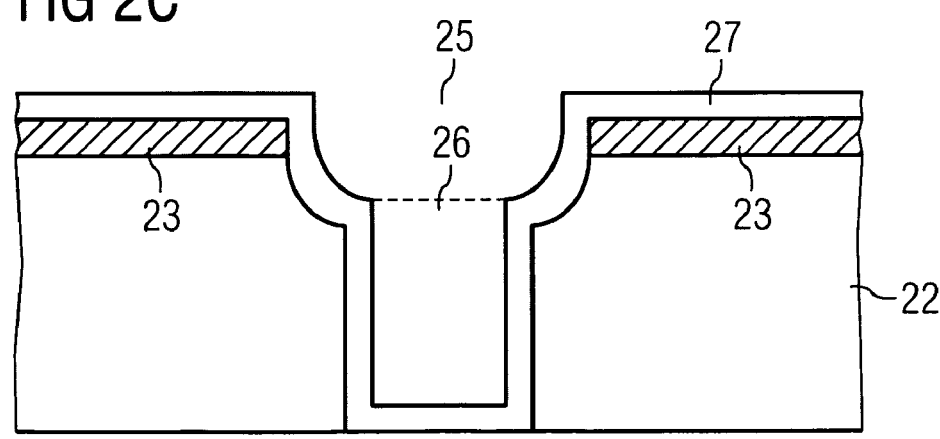

FIG. 2C illustrates the edge structure of the power component after the application of an insulator layer 27, e.g., silicon oxide having a thickness of 100 to 2000 nm.

FIG. 2D illustrates the edge structure of the power semiconductor component after the previously applied insulator layer has been patterned, e.g., by means of phototechnology and an electrically conductive layer 28 has been deposited on the first semiconductor surface and on parts of the first and second trenches.

FIG. 2E and FIG. 2F illustrate two embodiments of the finished processed edge structure of the power semiconductor component after the application of a second insulator material 29, e.g., polyimide, in order to prevent voltage flashovers during measurement and after mounting, and, depending on the embodiment, of an applied rear side metallization 30; in this case, the rear side metallization touches the edge of the trench oxide in FIG. 2E and the rear side metallization lies completely below the trench in FIG. 2F.

The edge structure of power semiconductor components is accorded a particular importance since the blocking capability of real PN junctions is drastically reduced compared with the bulk blocking capability of a plane-parallel junction because a major curvature of the equipotential lines and thus a significant increase in field strength occur in the edge region of the semiconductor component. The specified edge structure of a power semiconductor component, e.g., a diode or transistor, makes it possible to produce components of different voltage classes using a single mask set. The masks and the insulation layer thickness are dimensioned essentially only to the depth of the pn junction. For the blocking capability, it is necessary to choose a basic material adapted in accordance with the resistance and the thickness. In the case of transistors, at the very least a new calculation is not necessary for the edge structure. Particular advantages arise in the case of small device dimensions and expensive fabrication methods, since the loss of active chip area can be minimized with this edge termination.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a semiconductor body having a first surface, a second surface, a third surface, a first conduction type region and a second conduction type region, wherein the first surface is defined by the top surface of the second conduction type region, the second surface is defined by the bottom surface of the first conduction type region, and the third surface is defined as a junction between the bottom surface of the second conduction type region and the top surface of the first conduction type region;
   a trench extending into the semiconductor body from the first surface through the third surface and into the first conduction type region, the trench defined by a trench bottom and a mostly arcuately shaped sidewall extending downward from the third surface to the trench bottom, wherein the trench bottom lies at least 20% further away from the first surface of the semiconductor body than the third surface lies away from the first surface of the semiconductor body.

2. The semiconductor component of claim 1, where the first conduction type region is n conduction type, and the second conduction type region is p conduction type.

3. The semiconductor component of claim 1, comprising:
   a second trench extending from the trench bottom into the first conduction type region, having a second trench sidewall.

4. The semiconductor component of claim 3, comprising:
   an insulation layer applied to the arcuately shaped sidewall and the second trench sidewall.

5. The semiconductor component of claim 4, wherein the insulation layer at least partially extends over the first surface.

6. The semiconductor component of claim 5, comprising an electrically conductive layer in contact with the second conduction type region.

7. The semiconductor component of claim 6, wherein the electrically conductive layer partially extends over the insulation layer, including the arcuately shaped sidewall.

8. The semiconductor component of claim 7, comprising:
a second electrically conductive layer applied to the second surface of the semiconductor body, in contact with the first conduction type region.

9. The semiconductor component of claim 1, comprising:
an insulation material, where the trench and the second trench are filled with the insulation material and the insulation material at least partially extends over the electrically conductive layer.

10. The semiconductor component of claim 9, wherein the insulation material is a polyimide.

11. The semiconductor component of claim 9, the second trench having a second trench bottom, wherein the electrically conductive layer is deposited on the second trench bottom.

12. The semiconductor component of claim 1, wherein the semiconductor component functions as a diode.

13. The semiconductor component of claim 1, wherein the semiconductor component is a transistor.

14. A semiconductor component comprising:
a semiconductor body of a first conduction type and having a first surface and a second surface, the first surface being defined by the top surface of the semiconductor body and the second surface being defined by the bottom surface of the semiconductor body;
a second conduction type region provided on the first surface of the semiconductor body, the second conduction type region having a lower surface forming a junction with the first surface of the semiconductor body and an upper surface opposite the lower surface;
a first trench extending through the second conduction type region into the semiconductor body, the first trench being defined by a first trench bottom and a primarily arcuately shaped sidewall extending downward from the first surface to the first trench bottom, wherein the bottom of the first trench lies at least 20% further away from the upper surface of the second conduction type region than the first surface of the semiconductor body lies away from the upper surface of the second conduction type region;
a second trench extending from the first trench bottom into the first conduction type region and having a second trench sidewall;
an insulation layer applied to the arcuately shaped sidewall and the second trench sidewall, wherein the insulation layer at least partially extends over a surface of the second conduction type region; and
an electrically conductive layer in contact with the second conduction type region, wherein the electrically conductive layer partially extends over the insulation layer, including the arcuately shaped sidewall.

15. The semiconductor component of claim 14, wherein the first conduction type region is n conduction type, and the second conduction type region is p conduction type.

16. The semiconductor component of claim 14, comprising:
a second electrically conductive layer applied to the second surface of the semiconductor body.

17. The semiconductor component of claim 16, comprising:
an insulation material, wherein the first trench and the second trench are filled with the insulation material and the insulation material at least partially extends over the electrically conductive layer.

18. The semiconductor component of claim 17, wherein the insulation material is a polyimide.

19. The semiconductor component of claim 17, wherein the second trench has a second trench bottom and the electrically conductive layer is deposited on the second trench bottom.

20. The semiconductor component of claim 14, wherein the semiconductor component functions as a diode.

21. The semiconductor component of claim 14, wherein the semiconductor component functions as a transistor.

* * * * *